United States Patent
Mitchell et al.

(10) Patent No.: US 9,064,903 B2
(45) Date of Patent: Jun. 23, 2015

(54) ANALOG FLOATING-GATE MEMORY MANUFACTURING PROCESS IMPLEMENTING N-CHANNEL AND P-CHANNEL MOS TRANSISTORS

(71) Applicant: Texas Instruments Incorporated, Dallas, TX (US)

(72) Inventors: Allan T. Mitchell, Heath, TX (US); Imran Mahmood Khan, Richardson, TX (US); Michael A. Wu, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1 day.

(21) Appl. No.: 14/172,608

(22) Filed: Feb. 4, 2014

(65) Prior Publication Data

US 2014/0154850 A1    Jun. 5, 2014

Related U.S. Application Data

(62) Division of application No. 13/406,704, filed on Feb. 28, 2012.

(51) Int. Cl.
*H01L 27/06* (2006.01)
*H01L 29/66* (2006.01)
*H01L 21/265* (2006.01)
*H01L 29/10* (2006.01)
(Continued)

(52) U.S. Cl.
CPC ....... *H01L 29/66825* (2013.01); *H01L 23/5223* (2013.01); *H01L 27/1156* (2013.01); *H01L 28/40* (2013.01); *H01L 27/11517* (2013.01); *H01L 29/94* (2013.01); *H01L 28/60* (2013.01); *H01L 21/2652* (2013.01); *H01L 29/105* (2013.01)

(58) Field of Classification Search
CPC ............................ H01L 28/40; H01L 27/1156
USPC .................................... 257/296; 438/238, 239
See application file for complete search history.

(56) References Cited

U.S. PATENT DOCUMENTS

| 4,906,588 A | 3/1990 | Harrington, III |
| 8,178,915 B1 | 5/2012 | Mitchell et al. |

(Continued)

OTHER PUBLICATIONS

Ahuja et al., "A Very High Precision 500-nA CMOS Floating-Gate Analog Voltage Reference", J. Solid-State Circ., vol. 40, No. 12 (IEEE, Dec. 2005), pp. 2364-2372.

(Continued)

*Primary Examiner* — Wael Fahmy
*Assistant Examiner* — Tifney Skyles
(74) *Attorney, Agent, or Firm* — Rose Alyssa Keagy; Frank D. Cimino

(57) ABSTRACT

An analog floating-gate electrode in an integrated circuit, and method of fabricating the same, in which trapped charge can be stored for long durations. The analog floating-gate electrode is formed in a polycrystalline silicon gate level, doped n-type throughout its length, and includes portions serving as gate electrodes of n-channel and p-channel MOS transistors; a plate of a metal-to-poly storage capacitor; and a plate of poly-to-active tunneling capacitors. The p-channel MOS transistor includes a buried channel region, formed by way of ion implantation, disposed between its source and drain regions. Silicide-block silicon dioxide blocks the formation of silicide cladding on the electrode, while other polysilicon structures in the integrated circuit are silicide-clad.

5 Claims, 9 Drawing Sheets

(51) Int. Cl.
*H01L 23/522* (2006.01)
*H01L 27/115* (2006.01)
*H01L 49/02* (2006.01)
*H01L 29/94* (2006.01)

(56) References Cited

U.S. PATENT DOCUMENTS 8,558,296 B2 10/2013 Khan et al.
2009/0302364 A1* 12/2009 Duarte de Martin et al. . 257/296

OTHER PUBLICATIONS

Lande et al., "An Analog Floating-Gate Memory in a Standard Digital Technology", Proceedings of the Fifth International Conf. on Microelectronics for Neural Networks (IEEE, 1996), pp. 271-276.
Mazure et al., "Design Considerations for Sub-0-35um Buried Channel P-MOSFET Devices", Digest of Technical Papers, Symp. on VLSI Technology (IEEE, 1992), pp. 92-93.
Nishiuchi et al., "A Normally-Off Type Buried Channel MOSFET for VLSI Circuits", Int'l. Electron Devices Meeting (IEEE, 1978), pp. 26-29.

* cited by examiner

ANALOG FLOATING-GATE MEMORY MANUFACTURING PROCESS IMPLEMENTING N-CHANNEL AND P-CHANNEL MOS TRANSISTORS

CROSS-REFERENCE TO RELATED APPLICATIONS

This application is a divisional of U.S. application Ser. No. 13/406,704 filed Feb. 28, 2012, the contents which are herein incorporated by reference.

STATEMENT REGARDING FEDERALLY SPONSORED RESEARCH OR DEVELOPMENT

Not applicable.

BACKGROUND OF THE INVENTION

This invention is in the field of semiconductor integrated circuits. Embodiments of this invention are more specifically directed to structures storing an analog level for application to transistor gates.

An important type of semiconductor integrated circuits are those circuits that implement analog circuit functions in which input and output signals and information are communicated and processed as such. Analog circuit functionality is important in such diverse fields as instrumentation and control systems, audio applications, power management of large-scale electronic systems, communications functions, motor control functions (e.g., such as in hard disk drives), and the like. Some integrated circuits, for example interface circuitry such as analog-to-digital converters (ADCs) and digital-to-analog converters (DACs), include both analog and digital functionality.

Typically, analog integrated circuit functions rely on reference levels (voltages and currents) that are established and regulated on-chip. These reference levels are often involved in such functions as signal measurement, signal conditioning, conversion and interface functions (ADCs and DACs), etc. Proper functioning of the analog integrated circuit, and particularly such functioning over variations in power supply voltage, temperature, and other operating conditions, often critically depends on the stability of reference voltages and currents over such variations. In addition, manufacturing variations as reflected in physical parameters of the integrated circuits, can affect the reference levels as generated in these integrated circuits.

Accordingly, many analog integrated circuits include some ability to "trim" or adjust the on-chip precision reference circuits, as well as other circuit functions within those integrated circuits. Trimming is typically performed at manufacture, after electrical measurement or other evaluation of the performance of the raw circuit as manufactured. Various technologies for such trimming and adjustment are known, including laser trimming of resistors, and programming of fuses or antifuses in a digital control word that selectively shunts resistors within a resistor bank. Recently, programmable non-volatile memory elements have been considered for use as trimming elements, for example in replacement of fuses or antifuses. Examples of these non-volatile memory elements include floating-gate metal-oxide-semiconductor (MOS) transistors, in which the state of the transistor is defined by charge trapped at a floating gate electrode. Programming of the device is accomplished through such mechanisms as Fowler-Nordheim tunneling, and hot carrier injection.

Certain analog applications, such as high-precision ADCs and DACs, require extremely precise and stable reference circuits. Not only must the reference levels have a high initial accuracy (e.g., on the order of 1 mV for a reference voltage on the order of 5 volts), but temperature stability of on the order of 5 ppm/° C. and long-term drift of on the order of 10 ppm/1000 hours are also now commonly required. To achieve such precision, it is useful to more directly trim circuit elements, such as circuit elements at the inputs and in the feedback loops of amplifiers in the reference circuits. In addition, such direct trimming of circuit elements can result in reduced power consumption than resistor-bank type of trimming circuits, which is of course well-suited for modern battery-powered applications.

It is attractive to use floating-gate techniques to trim capacitors directly at the reference circuit amplifier, because of the precision with which charge may be programmed according to modern programming methods, and also because the programming operation can be carried out by purely electrical means. But any trapped charge applied in such trimming must be retained at the floating gate for the life of the device, considering that the trimming may only be performed at the time of manufacture. Conventional capacitor dielectric films in analog integrated circuits have been observed, in connection with this invention, to exhibit some degree of leakage over time. An example of such a conventional capacitor dielectric is silicon nitride deposited by plasma-enhanced chemical vapor deposition (PECVD). As such, the use of floating-gate capacitor technology in conventional analog circuits would require additional costly processes such as deposition of dielectric films specifically for the programmable capacitors, deposition and patterning of an additional conductor layer, and the like.

Ahuja et al., "A Very High Precision 500-nA CMOS Floating-Gate Analog Voltage Reference", *J. Solid-State Circ.*, Vol. 40, No. 12 (IEEE, December 2005), pp. 2364-72 describes the use of floating-gate technology in precision analog reference circuits. In this article, the floating-gate device is constructed as a double-level polysilicon device. Tunneling regions between the two polysilicon levels is formed as a 400 Å film of silicon dioxide. It is believed that the manufacturing process implemented into this structure is relatively costly, given the requirement that a separate tunneling oxide film be deposited. In addition, this approach uses a relatively thick tunneling oxide film, which results in a relatively small capacitance per unit area.

As described above, analog floating-gate electrodes effectively provide the function of a non-volatile analog memory, storing an analog level in the form of the level of charge trapped at the floating-gate electrode. Sensing of the stored state at an analog-floating gate electrode is typically performed by a portion of the analog floating-gate electrode serving as the gate electrode of a MOS transistor. In this way, the conduction of the MOS transistor under source/drain bias reflects the potential at its gate electrode, and thus correlates to the level of charge trapped at the analog floating-gate electrode. Copending and commonly assigned application Ser. No. 13/070,222, filed Mar. 23, 2011, entitled "Low Leakage Capacitor for Analog Floating-Gate Integrated Circuits", incorporated herein by this reference, describes such an analog floating-gate structure.

It would be desirable, in some applications, to realize analog floating-gate memory functions in a complementary-MOS (CMOS) fashion, with the analog floating-gate electrode serving as the gate electrode for both an n-channel MOS transistor and also a p-channel MOS transistor. Such an arrangement allows sensing of the charged state by the voltage at the common drain node of a CMOS transistor pair, facilitating the sensing and communication of the stored level. However, as known in the art, it is desirable that the silicon gate electrode be doped n-type for n-channel MOS transistors, and that the silicon gate electrode be doped p-type for p-channel MOS transistors. Therefore, in order for the unitary polysilicon floating-gate electrode to serve as the gate for both the p-channel and n-channel devices, that polysilicon electrode would preferably include both p-type and n-type portions, for those respective transistor gates. As known in the art, however, the provision of both p-type and n-type regions in a single silicon element necessarily results in a p-n (i.e., rectifying) junction within that element. FIG. 1 illustrates, in cross-section, an example of a portion of such a polysilicon floating-gate electrode 16, in a conventional integrated circuit environment in which it includes a p-type portion 16$p$ between n-type portions 16$n$.

In this example, electrode 16 is formed in a polysilicon layer, overlying gate dielectric film 17 at the surface of substrate 10. P-type doped portion 16$p$ of electrode 16 overlies n-type well 12; heavily-doped p-type source/drain regions will be disposed within that well 12 (e.g., orthogonal to the view of FIG. 1), typically in self-aligned fashion relative to electrode 16 in the conventional manner. Well 12 is disposed between isolation dielectric structures 15, as typical in the art. At some location away from n-well 12 in this conventional example, electrode 16 becomes n-type doped, forming n-type doped portions 16$n$ on both ends of p-type portion 16$p$, as shown. In the CMOS floating-gate context, electrode 16 will continue in its length in one or both of these directions, forming gates of n-channel MOS transistors. If implemented in an analog-floating-gate circuit implementation as will be described below, electrode 16 may also serve as a plate of a storage capacitor, and a plate of at least one tunnel capacitor.

In this conventional example of FIG. 1, a p-n metallurgical junction naturally forms at each interface between p-type doped portion 16$p$ and one of n-type doped portions 16$n$. The diodes defined at these metallurgical junctions have been observed, in connection with this invention, to alter the programmability of floating-gate electrode 16, in this conventional arrangement. As will be recognized by those in the art, the quality of the diode at this metallurgical junction will tend to be inconsistent from instance to instance within an integrated circuit, and especially over a manufacturing lot, considering that this diode is defined in polycrystalline silicon rather than single-crystal silicon. The diode quality will depend on such physical features as the grain size in the polysilicon relative to the width of electrode 16, the alignment of grain boundaries within the film and especially at the metallurgical junction, and the like. As such, in some instances, this diode is relatively leaky (i.e., operates as a poor diode, conducting in its reverse-biased state), while in other instances this diode is relatively good (i.e., relatively low conduction in the reverse-biased state). In any event, the propagation of signals or voltages along electrode 16 will be delayed as a result of these diodes. For electrodes 16 constructed as shown in FIG. 1 that are implemented as unitary transistor gates and floating gate capacitor plates, such as in an analog-floating-gate arrangement, these diodes will cause weaknesses in the programming of the stored states or levels.

By way of further background, copending and commonly assigned application Ser. No. 13/070,264, filed Mar. 23, 2011, entitled "Unitary Floating-Gate Electrode with Both N-Type and P-Type Gates", incorporated herein by reference, describes a single polycrystalline silicon (i.e., polysilicon) unitary floating-gate electrode, on which charge is trapped to set the state of the element, and that serves as the gate electrode for both the n-channel and p-channel MOS transistors in the CMOS circuit. As described therein, the analog floating-gate electrode is constructed in such a manner that the trapped charge can be stored for long durations. The analog floating-gate electrode is formed in a polycrystalline silicon gate level, and includes n-type and p-type doped portions serving as gate electrodes of n-channel and p-channel MOS transistors, respectively. Silicide cladding at selected locations of the polysilicon electrode shorts out the p-n junction between the n-type and p-type doped regions of the unitary electrode.

By way of further background, MOS transistors of the "buried channel" type are well known in the art. Such buried channel MOS transistors are generally constructed by way of a counter-doping ion implantation into the channel region, for example a boron implant into an n-well region, of a dose and energy so that the eventual source/drain conduction channel is at a desired depth below the surface of the channel region. The polysilicon gate electrodes of conventional buried channel transistors are typically doped to a conductivity type opposite that of the transistor channel conductivity type (e.g., an n-type doped gate electrode for a p-channel buried channel MOS transistor).

BRIEF SUMMARY OF THE INVENTION

Embodiments of this invention to provide a programmable analog floating-gate element, and method of fabricating the same, in which a unitary polycrystalline silicon element doped to one conductivity type (e.g., n-type) can serve as gate electrodes to both p-channel and n-channel transistors in a CMOS environment.

Embodiments of this invention provide such an element and method that can be efficiently implemented in an existing CMOS manufacturing process flow.

Other objects and advantages of embodiments of this invention will be apparent to those of ordinary skill in the art having reference to the following specification together with its drawings.

Embodiments of this invention may be implemented into an integrated circuit, at the polysilicon gate level. The integrated circuit may include polycrystalline silicon (polysilicon) gate electrodes that are doped to a single conductivity type (e.g., n-type). In an analog-floating-gate memory environment, this same polysilicon level, and indeed some of the same gate electrode elements, may serve as capacitor plates. In such an integrated circuit, portions of a given doped polysilicon gate electrode overlies active regions of both conductivity types, to serve as the gate electrode for both n-channel and p-channel transistors, respectively. The channel conductivity type transistors (e.g., the p-channel transistors) of opposite doping from the gate electrode (e.g., n-type) include a buried channel, permitting the oppositely-doped gate electrode to establish the desired transistor characteristics.

BRIEF DESCRIPTION OF THE SEVERAL VIEWS OF THE DRAWING

FIG. 2$b$ is an electrical diagram, in schematic form, of an analog circuit application of the device of FIG. 1 according to an embodiment of the invention.

DETAILED DESCRIPTION OF THE INVENTION

The present invention will be described in connection with one or more of its embodiments, namely as implemented into an analog floating-gate structure, because it is contemplated that this invention will be especially beneficial when used in such an application. However, it is also contemplated that this invention can provide important benefits in other circuit and structure applications. Accordingly, it is to be understood that the following description is provided by way of example only, and is not intended to limit the true scope of this invention as claimed.

Figure 2A:
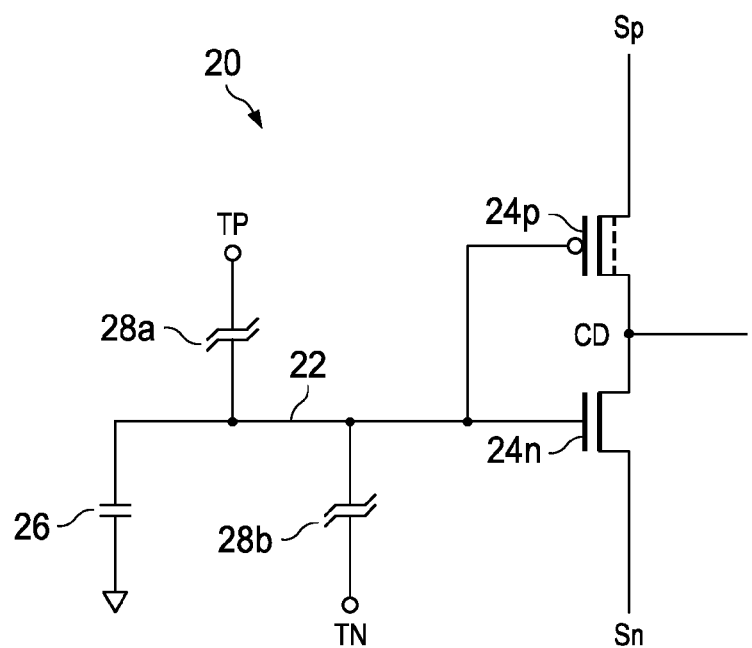
FIG. 2$a$ is an electrical diagram, in schematic form, of a programmable floating gate device constructed according to embodiments of the invention.

FIG. 2a illustrates an electrical schematic of analog floating-gate circuit 20 into which an embodiment of the invention is implemented. In this example, analog floating-gate electrode 22 is a single electrode serving multiple functions. Electrode 22 serves as the gate electrode for p-channel metal-oxide-semiconductor (MOS) transistor 24p, n-channel MOS transistor 24n, and as a first plate of storage capacitor 26. A second plate of storage capacitor 26 is coupled to a reference voltage, namely ground in this example. In this example, the drains of transistors 24n, 24p are connected together at common drain node CD, which is forwarded to a downstream circuit such as a sense amplifier. In operation, the voltage stored across storage capacitor 26 determines the voltage at the gate of MOS transistors 24p, 24n and thus relative current conducted by transistors 24p, 24n for a given bias between source Sp of transistor 24p and source Sn of transistor 24n.

In this implementation, analog floating-gate electrode 22 can be programmed to a particular analog state by way of tunnel capacitors 28a, 28b. Analog floating-gate electrode 22 serves also as a first plate of each of these tunnel capacitors 28a, 28b. In this example, a second plate of tunnel capacitor 28a is connected to a terminal TP, while a second plate of tunnel capacitor 28b is connected to a terminal TN. The capacitor dielectric for tunnel capacitors 28a, 28b is contemplated to be relatively thin, to allow mechanisms such as Fowler-Nordheim tunneling to transfer charge between terminals TP, TN and analog floating-gate electrode 22, depending on the bias.

In operation, analog floating-gate circuit 20 is programmed by the tunneling of electrons through tunnel capacitor 28b to analog floating-gate electrode 22, in response to a pulse of an appropriate negative voltage at terminal TN, relative to the voltage at terminal TP and to the ground reference voltage at the opposite plate of storage capacitor 26. An example of such a "programming" pulse, for a fully programmed level, is a voltage of about −11 volts at terminal TN relative to terminal TP and ground, for on the order of 20 msec. The voltage divider of capacitors 28a, 28b, 26 will result in most of that voltage appearing across tunnel capacitor 28b, enabling electrons to tunnel through its capacitor dielectric to analog floating-gate electrode 22. Those electrons will remain trapped at analog floating-gate electrode 22, considering that there is no direct (i.e., DC) connection between analog floating-gate electrode 22 and any other circuit element. Conversely, electrons can be removed from analog floating-gate electrode 22 by tunneling through tunnel capacitor 28a to terminal TP, upon application of an appropriate positive voltage at terminal TP relative to terminal TN and to the ground reference voltage at the opposite plate of storage capacitor 26. The voltage divider of capacitors 28b, 28a, 26 will result in most of that voltage appearing across tunnel capacitor 28a, enabling electrons to tunnel through its capacitor dielectric from analog floating-gate electrode 22. An example of such a "erase" pulse, to remove a fully programmed level, is a voltage of about +11 volts at terminal TP relative to terminal TN and ground, for on the order of 20 msec. The duration of the program and erase pulses can be adjusted to precisely set the charge state at analog floating-gate electrode 22. The charge trapped at analog floating-gate electrode 22 will thus define the voltage across storage capacitor 26, and thus the voltage at the gates of MOS transistors 24p, 24n. Tunnel capacitors 28b, 28a thus enable precise setting of the charge at analog floating-gate electrode 22, and thus precise adjustment of the analog state of the circuit including MOS transistor 24.

Circuit 20, in its form shown in FIG. 2a, essentially constitutes an analog memory element, storing a programmed analog level that is "read" by interrogating the output of transistors 24p, 24n at node CD. Alternatively, transistors 24p, 24n may serve as an input of another type of analog circuit, or another function such as an amplifier or the like, as will now be described in connection with FIG. 2b.

Figure 2B:
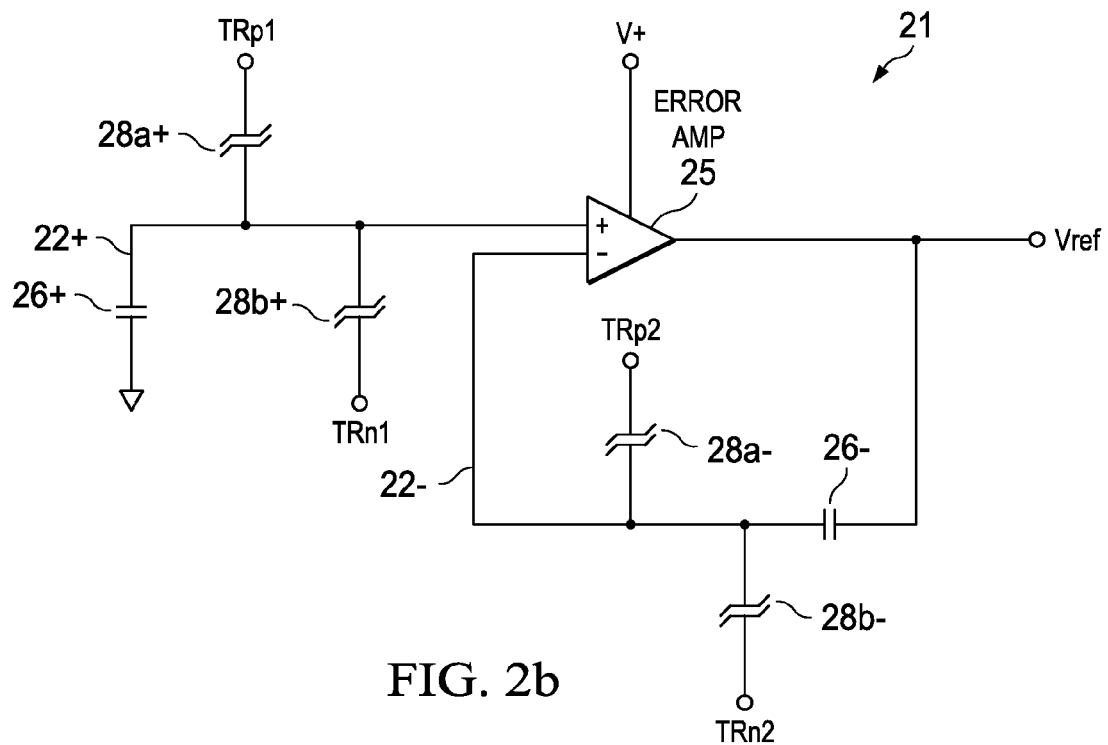

FIG. 2b illustrates an example of a circuit implementation according to embodiments of this invention, by way of reference voltage circuit 21. Reference voltage circuit 21 generates a reference voltage at the output node Vref of error amplifier 25, which is a conventional two-input operational amplifier (op amp), biased from power supply voltage V+. Error amplifier 25 has a positive (non-inverting) input that receives a voltage from the top plate of storage capacitor 26+, the other plate of which is at ground, and a negative (inverting) input that is connected to one plate of feedback capacitor 26−, the other plate of which is connected to the output of error amplifier 25 at node Vref. In this example, analog floating gate structure 22+ serves as the top plate of capacitor 26+, and is applied to the non-inverting input of error amplifier 25 by serving as the gate electrode for one or more MOS transistors (not shown) at that input. Similarly, analog floating-gate electrode 22− serves as a plate of feedback capacitor 26− and is also applied to the inverting input of error amplifier 25 by serving as the gate electrode for one or more MOS transistors (not shown) at that input.

Each of analog floating gate structures 22+, 22− in reference voltage circuit 21 of FIG. 2b can be programmed with a desired level of charge, by way of Fowler-Nordheim tunneling. The programming of analog floating gate structure 22+ is accomplished via tunnel capacitors 28a+, 28b+ from terminals TRp1, TRn1, respectively, and the programming of analog floating-gate electrode 22− is accomplished via tunnel capacitors 28a−, 28b− from terminals TRp2, TRn2, respectively. As such, analog floating gate structures 22+, 22− in reference voltage circuit 21 are constructed and function according to the generalized form of analog floating-gate electrode 22 of FIG. 2a.

In operation, the voltage appearing at the non-inverting input of error amplifier 25 is defined by the amount of charge trapped at analog floating gate electrode 22+ as a result of programming via tunnel capacitors 28a+, 28b+. Similarly, the feedback voltage applied to the inverting input of error amplifier 25 is adjusted by the amount of charge trapped at analog floating-gate electrode 22– as a result of programming via tunnel capacitors 28a–, 28b–. As a result, the reference voltage level at output node Vref of error amplifier 25, and the gain of error amplifier 25 (i.e., the feedback loop) can be precisely adjusted in reference voltage circuit 30, by the programming of the charge trapped at analog floating-gate electrodes 22+, 22–.

Reference voltage circuit 21 of FIG. 2b is provided by way of example only. It is contemplated that the analog floating gate circuit of embodiments of this invention can also be implemented, with great advantage, in other circuit environments, including programmable gate array structures, trim capability for analog circuits and reference circuits in digital circuits, level shift circuits, multi-bit EEPROM memory cells (i.e., in which each floating gate memory cell is capable of storing intermediate levels), and the like. Those skilled in the art having reference to this specification will readily comprehend these, and other, alternative uses of embodiments of this invention.

Figure 1:
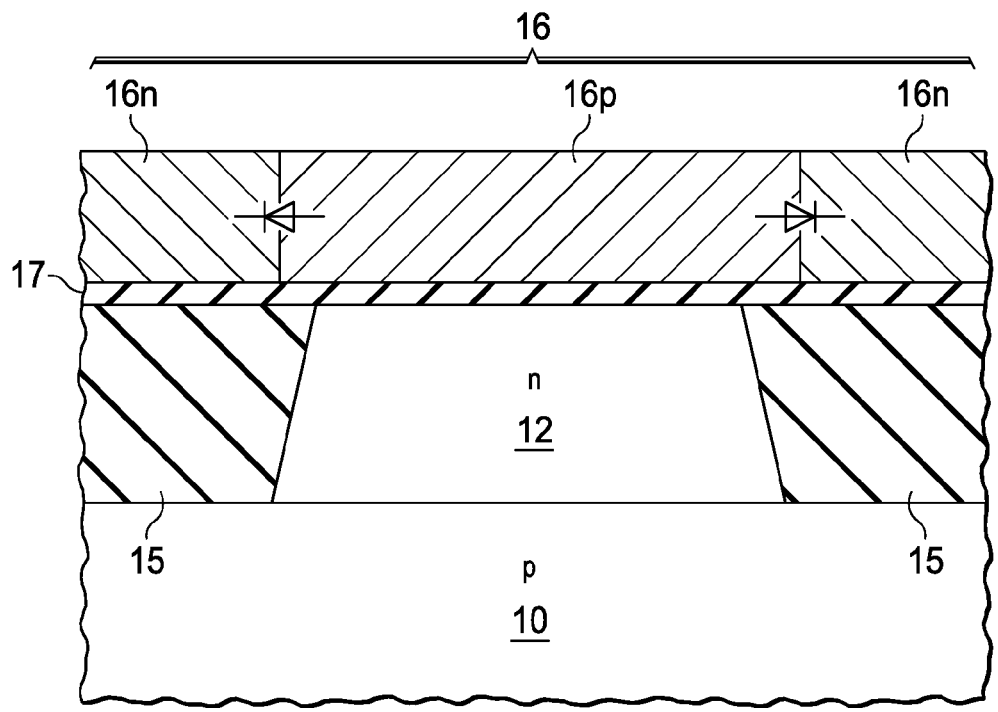
FIG. 1 is cross-sectional view of a portion of a conventional floating-gate device including both n-type and p-type portions.

As evident from FIG. 2a, unitary analog floating-gate electrode 22 serves as the gate of p-channel transistor 24p and also as the gate of n-channel transistor 24n. As fundamental in the art, conventional p-channel MOS transistors are constructed with p-type polysilicon gates and n-channel MOS transistors are constructed with n-type polysilicon gates, to attain useful enhancement mode characteristics. But in the unitary gate arrangement for an analog floating-gate cell, if this unitary electrode were doped p-type in its portion serving as the gate for the p-channel transistor, and were doped n-type in its portion serving as the gate for the n-channel transistor and as capacitor plates, a parasitic diode would be present at each junction between those n-type and p-type portions, as discussed above relative to FIG. 1. Because the programming mechanism relies on electrons tunneling to the unitary floating-gate electrode through the tunnel capacitors, the extent and rapidity with which those electrons would be conducted to the gate of the p-channel transistor would depend on the characteristics of that diode at the metallurgical junction between the n-type and p-type portions of the electrode, such characteristics varying widely from cell to cell. It has therefore been observed, according to this invention, that such parasitic diodes within the unitary electrode introduces substantial variability into the programming and erase performance.

According to embodiments of this invention, however, unitary polysilicon floating-gate electrode 22 is doped to the same conductivity type (e.g., n-type) throughout its entire length, including in its portions serving as the gate of p-channel MOS transistor 24p. As such, no p-n junctions and thus no parasitic diodes are present within unitary polysilicon floating-gate electrode 22. This common conductivity type for unitary polysilicon floating-gate electrode 22 is enabled by its construction, including p-channel MOS transistor 24p as a "buried-channel" MOS transistor, as will now be described in connection with FIGS. 3a through 3g.

Figure 3B:
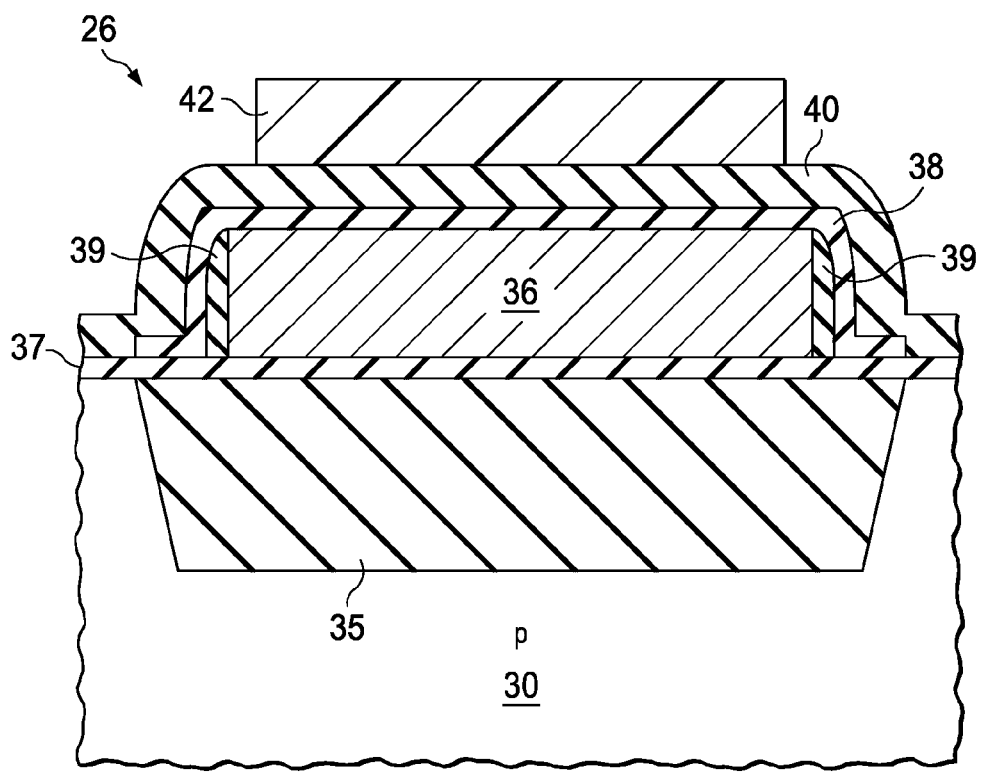
FIGS. 3b through 3g are cross-sectional views of structures formed in connection with the analog-floating-gate structure of FIG. 3a, according to that embodiment of the invention.
Figure 3A:
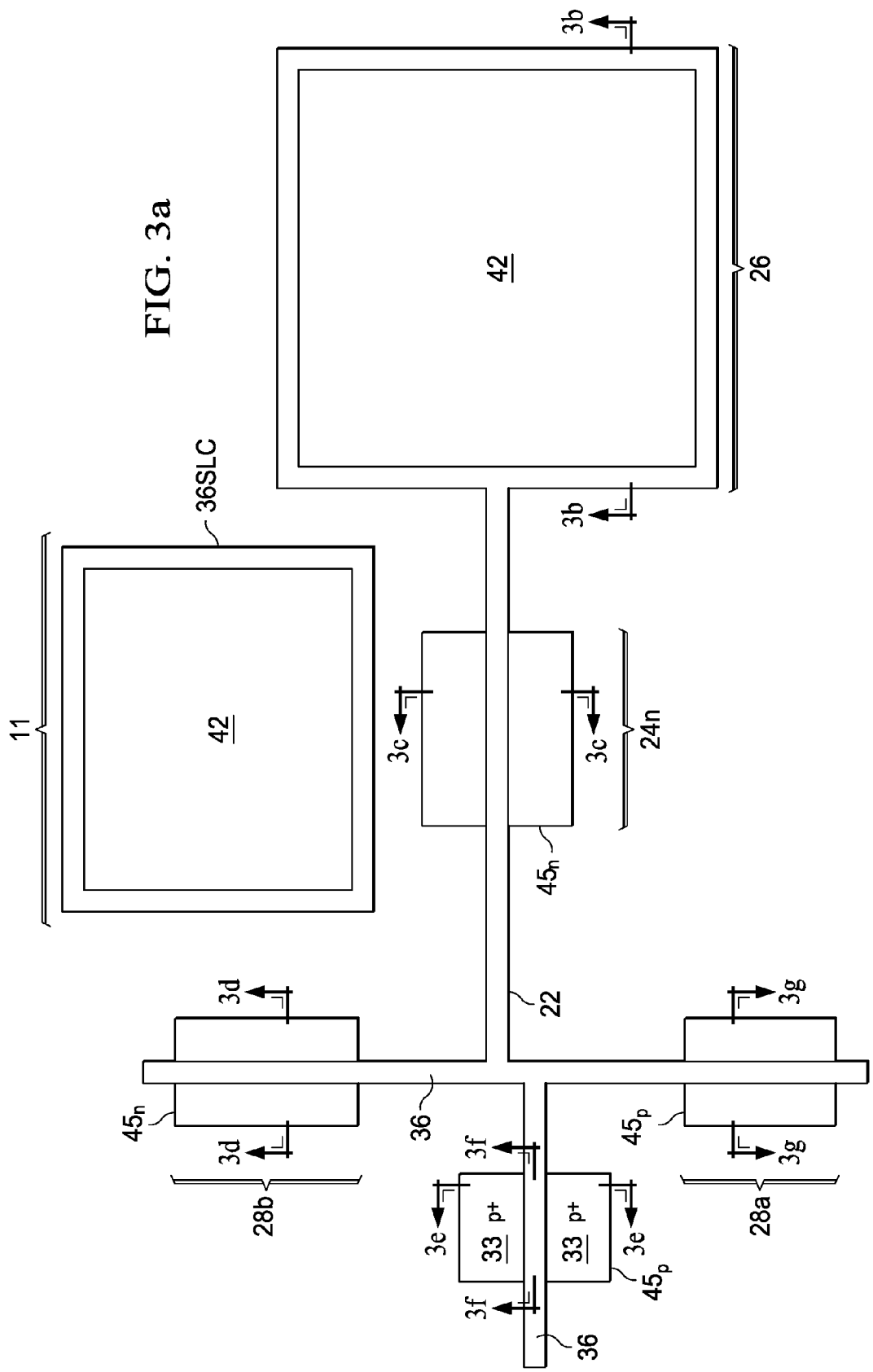
FIG. 3a is a plan view of the physical construction of an analog floating-gate structure, according to an embodiment of the invention.

FIG. 3a illustrates, in plan view, the construction of a circuit such as that shown in connection with FIG. 2a, according to an embodiment of this invention. Corresponding FIGS. 3b through 3g illustrate, in cross-section, the construction of various structures shown in FIG. 3a, including buried channel p-channel MOS transistor 24p according to an embodiment of the invention. It is contemplated that the sizes of elements shown in FIGS. 3a through 3g are not necessarily to scale, relative to one another. For example, the element widths shown in FIG. 3a may in actuality be substantially thinner, relative to the length of the same element, than that shown, depending on the manufacturing technology utilized. Similarly, the relative thicknesses of elements in the cross-sectional views of FIGS. 3b through 3g (and FIGS. 5a through 5f described below) may not correspond to that encountered in actual devices. In any case, it is contemplated that this embodiment of the invention may be implemented using relatively aggressive manufacturing technology, extending into the sub-micron regime. It is therefore contemplated that those skilled in the art having reference to this specification will be readily able to adapt the structures of FIGS. 3a through 3c in the desired manufacturing technology, without undue experimentation.

As shown in FIG. 3a, analog floating-gate electrode 22 is constructed of polycrystalline silicon (polysilicon) element 36, which extends over the surface of a semiconductor wafer (or, in the silicon-on-insulator context, a support wafer having a semiconductor layer at a surface), to reach multiple devices or components. As will be described in further detail below, polysilicon element 36 is doped n-type throughout its length. In this example, polysilicon element 36 has a widened portion at one end, serving as a lower plate of storage capacitor 26, and has an elongated portion extending from storage capacitor 26 that overlies two instances of active region $45_n$ and two instances of active region 45p. In each instance, polysilicon element 36 is separated from the surface of active regions $45_n$, $45_p$ by a gate dielectric layer, formed of silicon dioxide, silicon nitride, a combination of the two, or some other suitable gate dielectric material as known in the art. Active regions $45_n$, $45_p$ shown in FIG. 3a are defined in the conventional manner as regions of the semiconductor surface at which isolation dielectric structures are not located. At one instance of active region $45_n$, polysilicon electrode 36 defines a gate electrode of n-channel transistor 24n; at another instance of active region $45_n$, polysilicon electrode 36 forms an upper plate of tunnel capacitor 28b. Similarly, at one instance of active region $45_p$, polysilicon electrode 36 forms the gate electrode of p-channel transistor 24p, and at another instance of active region $45_p$, polysilicon electrode 36 serves as an upper plate of tunnel capacitor 28a. Polysilicon structure 36 overlies isolation dielectric structures at all locations other than at active regions 45n, $45_p$ at which transistors 24p, 24n, and tunnel capacitors 28a, 28b are formed.

FIG. 3b illustrates, in cross-section, the construction of storage capacitor 26 according to this embodiment of the invention. In this example, the lower plate portion of n-type doped polysilicon element 36 overlies isolation dielectric structure 35. Isolation dielectric structures 35 in this embodiment of the invention are of the shallow trench isolation type, and consist of silicon dioxide deposited into shallow trenches etched into the surface of substrate 30; alternatively, isolation dielectric structures 35 may be formed of other material, or by a different technique such as local oxidation of silicon (LOCOS). Gate dielectric 37, for example formed of deposited silicon dioxide, is disposed between the surface of isolation dielectric structure 35 and polysilicon element 36n. In this example, the surface into which isolation dielectric structure 35 is formed is the top surface of p-type silicon substrate 30. In this embodiment of the invention, the capacitor dielectric of storage capacitor 26 is formed of silicon dioxide layer 38 disposed at the top surface of polysilicon element 36, and silicon nitride layer 40 disposed over silicon dioxide layer 38. Sidewall nitride (i.e., silicon nitride) elements 39 are disposed along the sidewalls of polysilicon element 36n, underlying silicon dioxide layer 38. Upper plate 42 of storage capacitor 26 is formed of a metal or metal compound, for example of tantalum nitride, which overlies the widened portion of polysilicon element 36, separated therefrom by the capacitor dielectric of silicon dioxide layer 38 and silicon nitride layer 40.

According to embodiments of this invention, silicon dioxide layer 38 serves as a "silicide-block" dielectric. As known in the art, many integrated circuits are constructed to include a metal silicide cladding at certain silicon structures, such as transistor gate electrodes and polysilicon interconnects, to improve the conductivity of those structures. Conventionally, this metal silicide cladding is performed by direct reaction of a metal (e.g., cobalt, titanium, tungsten) deposited over the silicon structures to be silicide-clad, followed by a high temperature anneal to react the deposited metal with the underlying silicon. An etch is then performed to remove the unreacted metal from those locations at which the metal was not in contact with underlying silicon (e.g., over isolation dielectric structures 35 or gate dielectric 37). According to embodiments of this invention, as will be described in detail below, silicidation of polysilicon element 36 forming unitary analog floating-gate electrode 22 is prevented by silicide-block silicon dioxide layer 38.

Silicide-block silicon dioxide layer 38 is removed from those structures within the same polysilicon level as analog floating-gate electrode 22 in this integrated circuit that are to be silicide-clad, by way of a patterned etch. For example, FIG. 3a illustrates nearby unrelated capacitor 11, which is in the same integrated circuit as analog floating-gate electrode 22, and includes an element in the same polysilicon level as polysilicon element 36 forming analog floating-gate 22 but that is not contiguous with analog floating-gate electrode 22. In this example, a lower plate of capacitor 11 is formed of silicide-clad polysilicon element 36SLC (doped either n-type or p-type), overlying isolation dielectric structure 35. In this instance of capacitor 11, a metal silicide has been formed in the conventional manner at the surface of polysilicon element 36SLC.

Figure 3C:
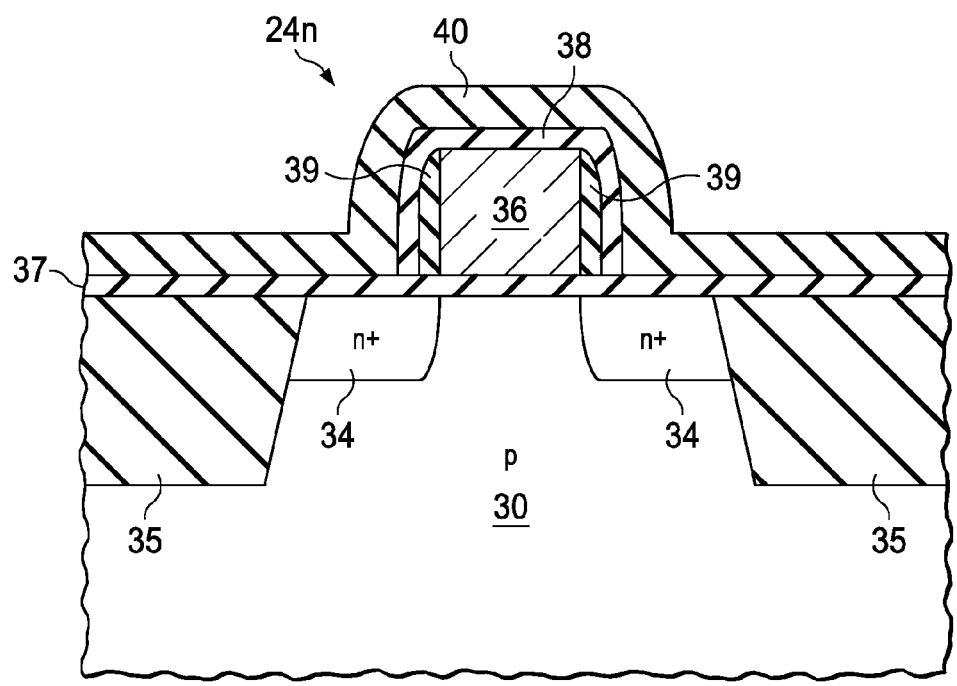

As shown in FIGS. 3a and 3c, n-type doped polysilicon electrode 36 also defines a gate electrode of n-channel transistor 24n, with gate dielectric 37 disposed between polysilicon electrode 36 and the surface of an instance of active region $45_n$. This instance of active region $45_n$ is disposed between isolation dielectric structures 35, and is at a surface of p-type substrate 30; alternatively, this active region $45_n$ may be formed at the surface of a p-type well that is formed into the substrate, as known in the art. According to this embodiment of the invention, n-channel MOS transistor 24n includes heavily-doped n-type source/drain regions 34, formed on opposite sides of polysilicon element 36, in the conventional self-aligned fashion. Sidewall nitride elements 39, on the sidewalls of polysilicon element 36, space the heavily doped source/drain implant from the edges of the gate; in the conventional manner, lightly-doped source/drain extensions may be present under sidewall nitride elements 39, having been implanted before the formation of that film. The particular source/drain junction gradients can be engineered to the desired profile, as well known in the art. Silicide-block silicon dioxide layer 38 and silicon nitride layer 40 are disposed over polysilicon electrode 36, as shown.

Figure 3D:
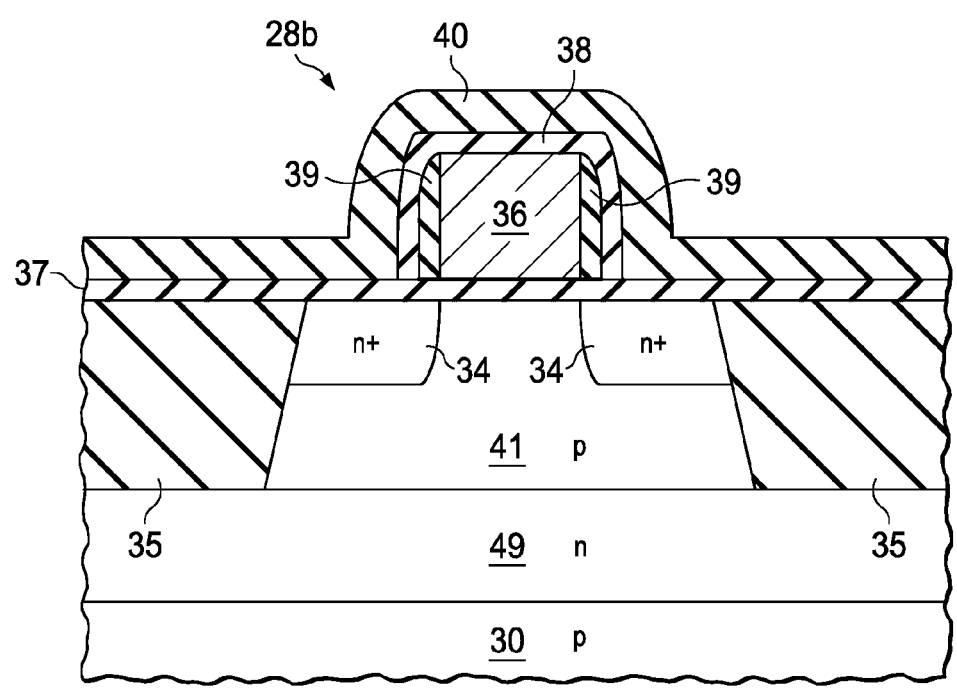
Figure 4:
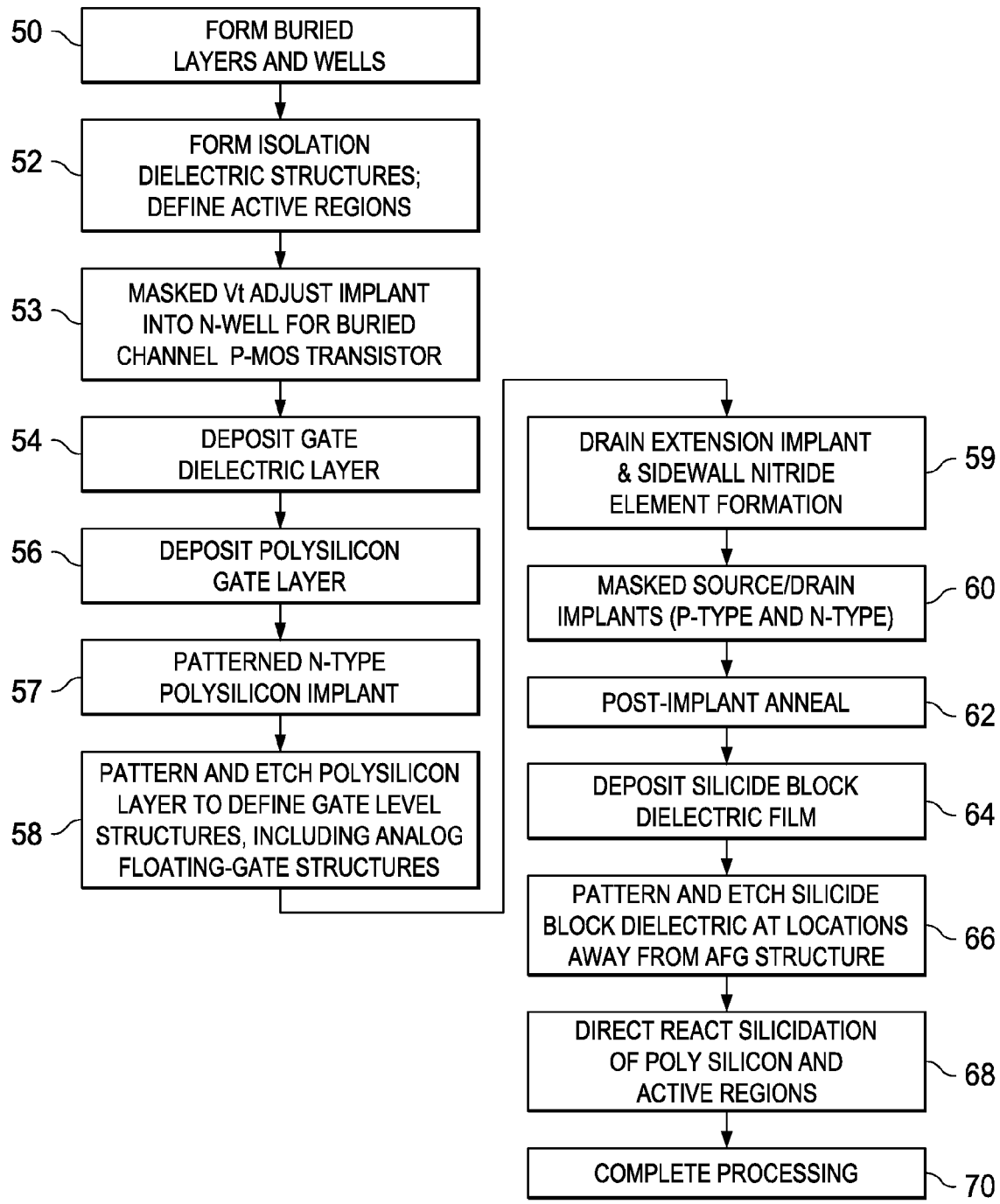
FIG. 4 is a flow diagram illustrating a method of fabrication of the analog-floating-gate structure of FIGS. 3a through 3g, according to an embodiment of the invention.

Analog floating-gate electrode 22 also extends over another instance of active region $45_n$ to form tunneling capacitor 28b, as shown in FIGS. 3a and 3d. In this location of the integrated circuit, n-type doped polysilicon element 36 is protected from silicidation by silicide-block silicon dioxide layer 38, as at other locations of the structure. Gate dielectric 37 is disposed between polysilicon element 36 and the surface of active region $45_n$ at this location, serving as the capacitor dielectric of tunnel capacitor 8n. Silicon nitride layer 40 is disposed overall, as shown in FIG. 4e.

The underlying structure of tunnel capacitor 28b differs from that of transistor 24n, in this example. N-type buried layer 39 is disposed at this location, to a relatively deep extent underlying the surface, to define isolated p-type well 41 at depths shallower than n-type buried layer 39 and the surface. P-type well 41 is isolated in the sense that it is not electrically connected or physically in contact to other p-type wells within the integrated circuit; in this example, p-type well 41 is contained between isolation dielectric structures 35 as shown. P-type well 41 is a relatively lightly-doped p-type region, as typical for well structures in the art. Heavily-doped n-type regions 34 are disposed on opposite sides of polysilicon element 36 in this active region $45_{gn}$, spaced apart from the gate edges by sidewall nitride elements 39, in the conventional self-aligned manner for source and drain regions such as that of n-channel MOS transistor 4n described above in connection with FIG. 3d, with lightly-doped source/drain extensions as shown. While not shown in FIGS. 3a and 3d, top-side contacts to overlying metal conductors are provided in connection with tunneling capacitor 28b to short together n+ regions 34 and p-well 41, so as to implement a tunnel capacitor rather than an MOS transistor. Gate dielectric 37 is sufficiently thin that, upon the voltage at p-well 41 and n+ regions 34 being driven to a negative voltage during program operations (n-type buried layer 39 at ground or some other stable voltage), electrons can tunnel through gate dielectric 37 and become trapped at analog floating-gate electrode 22.

Further detail regarding the construction of n-channel transistor 24n, tunnel capacitor 28b, storage capacitor 26, and unrelated capacitor 11, according to embodiments of this invention is provided in the above-incorporated application Ser. No. 13/070,264 and Ser. No. 13/070,222.

Figure 3E:
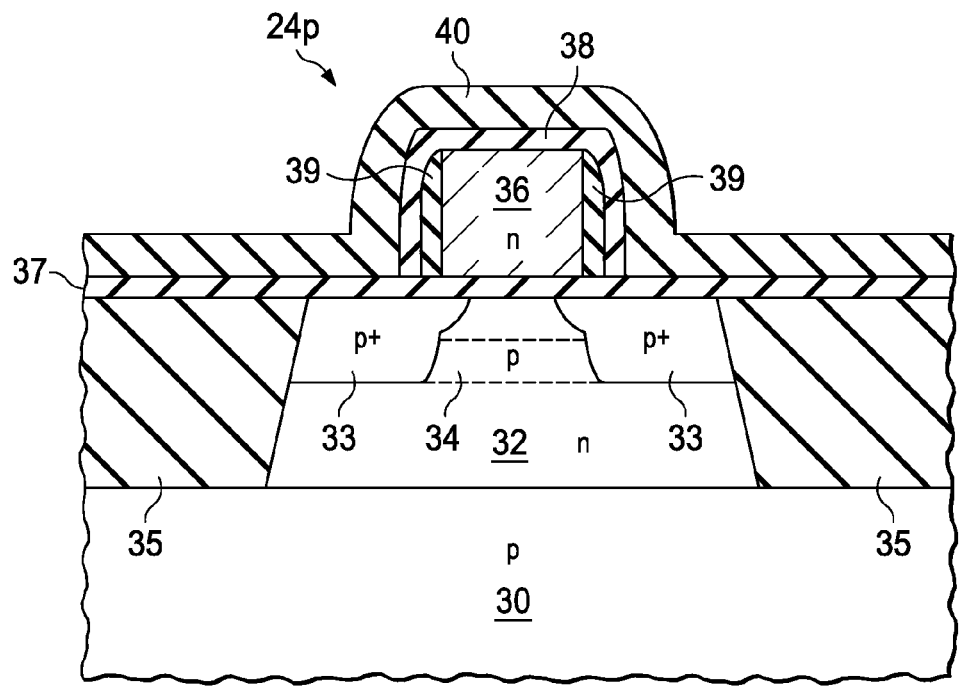
Figure 3F:
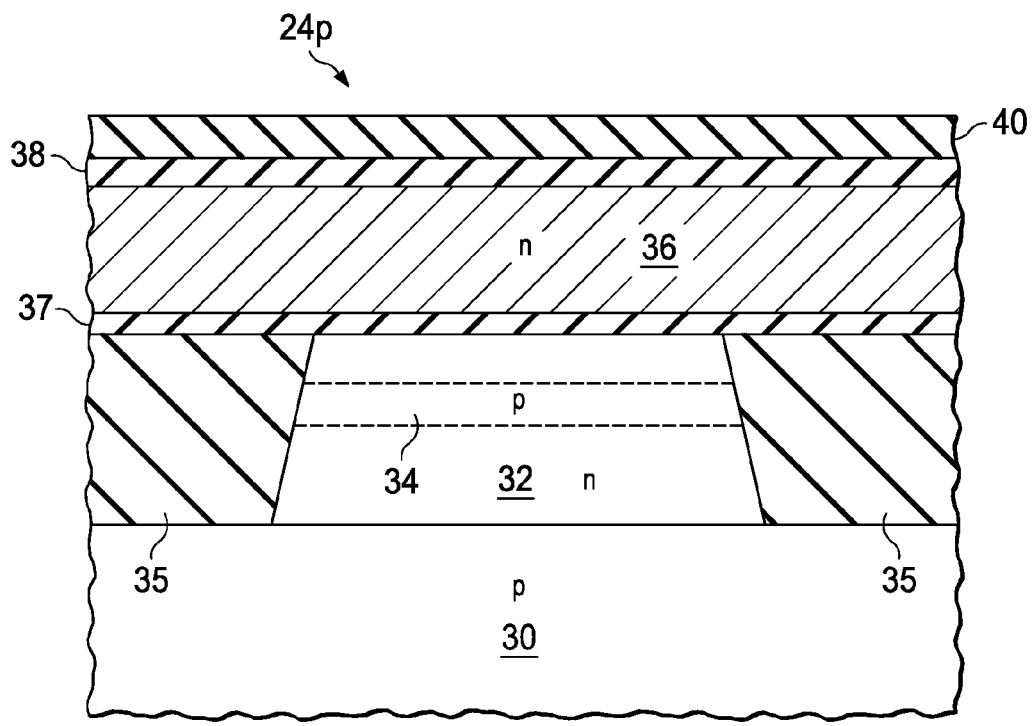

Referring now to FIGS. 3e and 3f, the construction of buried channel p-channel transistor 24p, according to embodiments of this invention, will now be described in detail. FIG. 3e illustrates transistor 24p in a cross-sectional view taken perpendicular to the run of polysilicon element 36 at active region $45_p$, while FIG. 3f is a cross-sectional view of transistor 24p taken parallel with and underlying polysilicon element 36 at active region $45_p$.

As shown in both FIGS. 3e and 3f, transistor 24p is formed at a location of the surface of p-type silicon substrate 30 at which isolation dielectric structures 35 are not present (i.e., in an opening in a contiguous isolation dielectric structure 35). N-type well 32 is present at the location of this instance of active region $45_p$ (FIG. 3a), and consists of a relatively lightly-doped n-type region, formed into substrate 30 at this location by a masked ion implantation and subsequent anneal. Polysilicon element 36 is separated from the surface of n-type well 32 by gate dielectric layer 37.

The perpendicular view of FIG. 3e illustrates the location of heavily-doped p-type (p+) source/drain regions 33 on either side of polysilicon electrode 36. According to embodiments of this invention, p+ source/drain regions 33 are formed by ion implantation into n-type well 32 in the well-known self-aligned manner. In this particular embodiment of the invention, sidewall dielectric filaments 39 (e.g., of silicon nitride) are present on the sides of polysilicon electrode 36, for use in defining the source/drain implant in two steps in the well-known manner for forming shallower "drain extension" regions abutting the region underlying polysilicon electrode 36 at the surface of n-type well 32, as suggested by FIG. 3e. Silicon nitride layer 40 is disposed over silicide-block silicon dioxide layer 38 as shown in FIGS. 3e and 3f, and for the other structures defined by polysilicon electrode 36.

As mentioned above, polysilicon electrode 36 is doped n-type in embodiments of this invention, despite serving as the gate for p-channel transistor 24p. For surface-channel MOS transistors, this opposite conductivity type polysilicon gate is generally not desirable, as the threshold voltage will tend to be very high in such devices. To address this, buried channel region 34 is provided within n-type well 32 as shown in FIGS. 3e and 3f, at a desired depth below the surface of n-type well 32 and extending between source/drain regions 33 in transistor 24p. Buried channel region 34 is formed by an ion implant and subsequent anneal sufficient to counter-dope n-type well 32 at the desired depth and location. Buried channel region 34 defines the location of the conduction channel between source/drain regions 33 under bias in an "on" state; as evident from FIG. 3e, this conduction channel is thus located some depth below the surface of n-type well 32. As a result, transistor 24p is not subject to the severe "short-channel" effects that are problematic in some surface channel transistors, especially at minimum channel lengths.

In embodiments of this invention, buried channel 34 provides the important benefit of counteracting the n-type doping of polysilicon electrode 36 that avoids a rectifying p-n junction within electrode 36, as discussed above. For surface channel p-channel MOS transistors, an n-type polysilicon gate electrode would result in an undesirably high threshold voltage (i.e., gate-to-source voltage at which source/drain conduction commences), for example as high (in absolute magnitude) as −1.5 volts. Buried channel 34 reduces the threshold voltage of p-channel transistor 24p to a level more consistent with that of n-channel transistor 24n, for example on the order of −0.7 volts.

Due to the presence of buried channel 34, the drain extensions of source/drain regions 33 are not particularly necessary, as source/drain conduction is not occurring at the surface. However, these drain extensions may be present in transistor 24p if provided for p-channel surface-channel transistors formed elsewhere in the integrated circuit, to facilitate the manufacturing process flow.

Figure 3G:
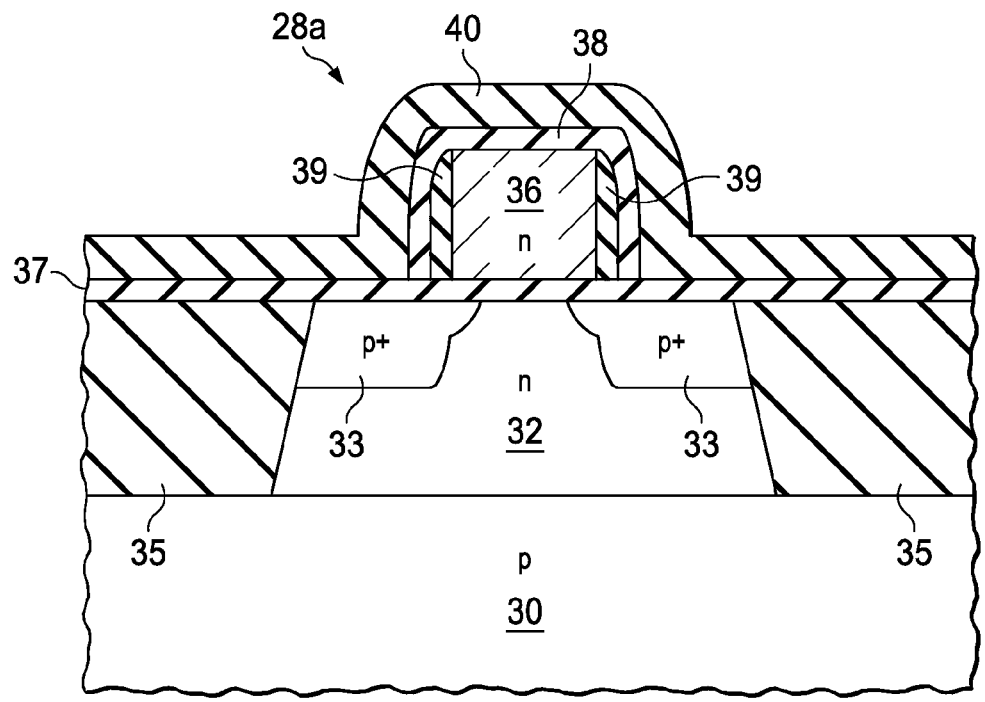

FIG. 3g illustrates the construction of tunnel capacitor 28a in the arrangement of FIG. 3a, by way of a cross-sectional view taken perpendicularly to the run of polysilicon electrode 36 in its location. As evident from FIG. 3g, tunnel capacitor 28a is essentially identical to that of p-channel transistor 24p shown in FIGS. 3e and 3f, except that buried channel 34 is not present in tunnel capacitor 28a. As will be described in further detail below, the mask pattern used to define the locations of buried channel 34 will block the location of tunnel capacitor 28a from receiving the buried channel threshold adjust ion implant. While not shown in FIGS. 3a and 3g, top-side contacts to overlying metal conductors are provided in connection with tunneling capacitor 28b to short together p+ regions 33 and n-type well 32, so as to implement a tunnel capacitor rather than an MOS transistor. As described in the above-incorporated application Ser. No. 13/070,264 and Ser. No. 13/070,222, the conduction of interest in tunnel capacitor 28a is the conduction of electrons from polysilicon element 36 (in its role as analog floating-gate electrode 22) through gate dielectric 37 and into p+ regions 33 and n-type well 32 at which a positive bias voltage is applied.

Figure 5A:
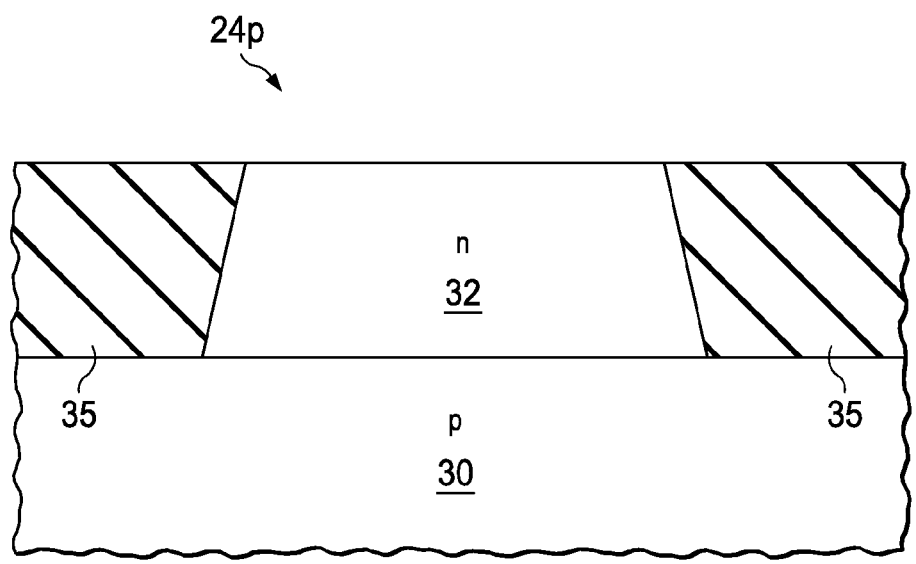
FIGS. 5a through 5e are cross-sectional views of the transistor of FIGS. 3e and 3f at various stages of manufacture according to the method of FIG. 4.

A process of fabricating analog floating-gate structure 22 as shown in FIGS. 3a through 3g, in combination with its transistors 24p, 24n and other structures according to embodiments of this invention, will now be described in detail in connection with FIGS. 4 and 5a through 5e. This fabrication process flow begins with process 50, in which various doped regions are defined and formed into the semiconducting surface of substrate 30. These doped regions include regions such as n-type well 32, n-type buried layer 49 underlying n-channel transistor 24n, p-type wells 41 as desired, and the like, depending on the desired eventual structures. In process 52, isolation dielectric structures 35 are formed at selected locations of the surface. These isolation dielectric structures 35 may be formed in various conventional ways, including shallow trench isolation, deep trench isolation, local oxidation of silicon (LOCOS), and the like. As known in the art, isolation dielectric structures 35 define the locations of active regions of the semiconducting surface, at which transistors and some capacitors are formed. While process 50 is shown as preceding process 52 in this example, in some manufacturing flows, the order of these steps may be reversed; further in the alternative, some wells and buried layers may be formed prior to isolation dielectric structures 35, with others formed after the formation of those isolation dielectric structures. FIG. 5a illustrates, in cross-section, the portion of substrate 30 at which p-channel transistor 24p is being formed, at a point in its manufacture following processes 50 and 52.

Figure 5B:
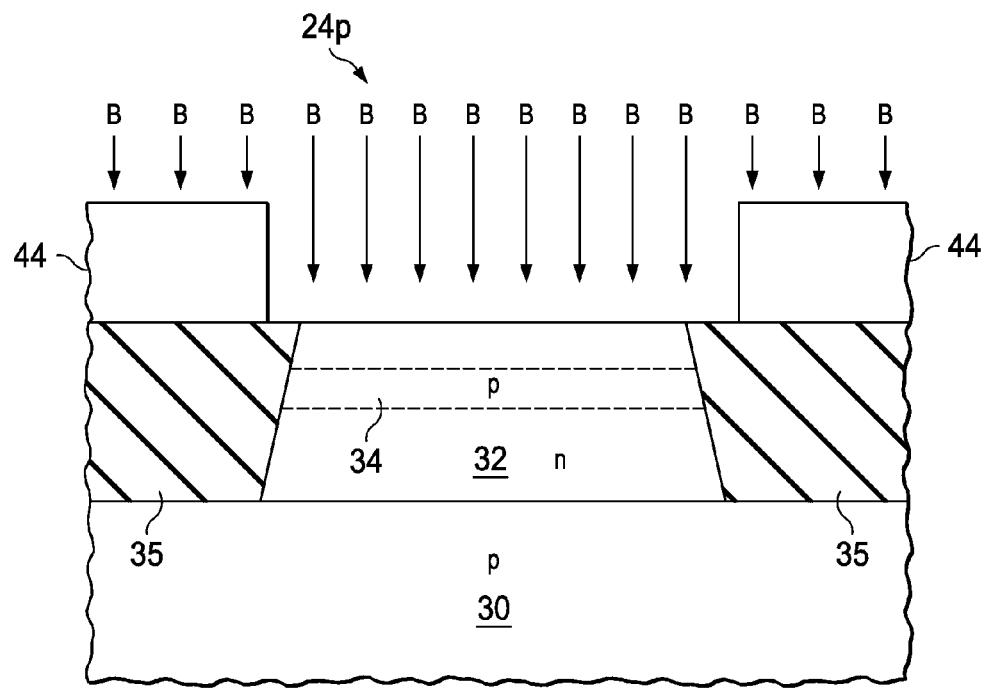

Following the definition of active regions at the surfaces of the desired well or wells (processes 50, 52), a masked threshold voltage adjust ion implantation is performed in process 52, by way of which buried channel 34 in p-channel transistor 24p is defined. FIG. 5b illustrates this ion implantation at the location of p-channel transistor 24p. In this example, photoresist structures 44 are formed by conventional deposition and photolithography to mask the implant of process 53 from the appropriate locations, while exposing the surface of n-type well 32 at the location of p-channel transistor 24p, as shown in FIG. 5b. Ion implantation of the desired species (e.g., boron) at the appropriate dose and energy for forming buried channel 34 at the desired depth in n-type well 32 is then performed; this implant may be either normal to the surface of substrate 30, or an angled implant, as desired. It is contemplated that those skilled in the art having reference to this specification will be readily able to design, without undue experimentation, the appropriate dose, energy, etc. for the buried channel $V_t$ ion implant of process 53, considering the dopant concentration of n-type well 32, the desired depth of buried channel 34, and other factors.

Gate dielectric layer 37 is then formed in process 54. Gate dielectric 37 may be a deposited insulator, such as silicon dioxide, especially in modern sub-micron manufacturing processes with constrained thermal budgets. Alternatively, gate dielectric layer 37 may be formed by thermal oxidation of silicon, in the conventional manner. Following the formation of gate dielectric layer 37 in process 54, a polycrystalline silicon layer from which polysilicon elements 36 are to be formed is then deposited overall, in process 56.

Figure 5C:
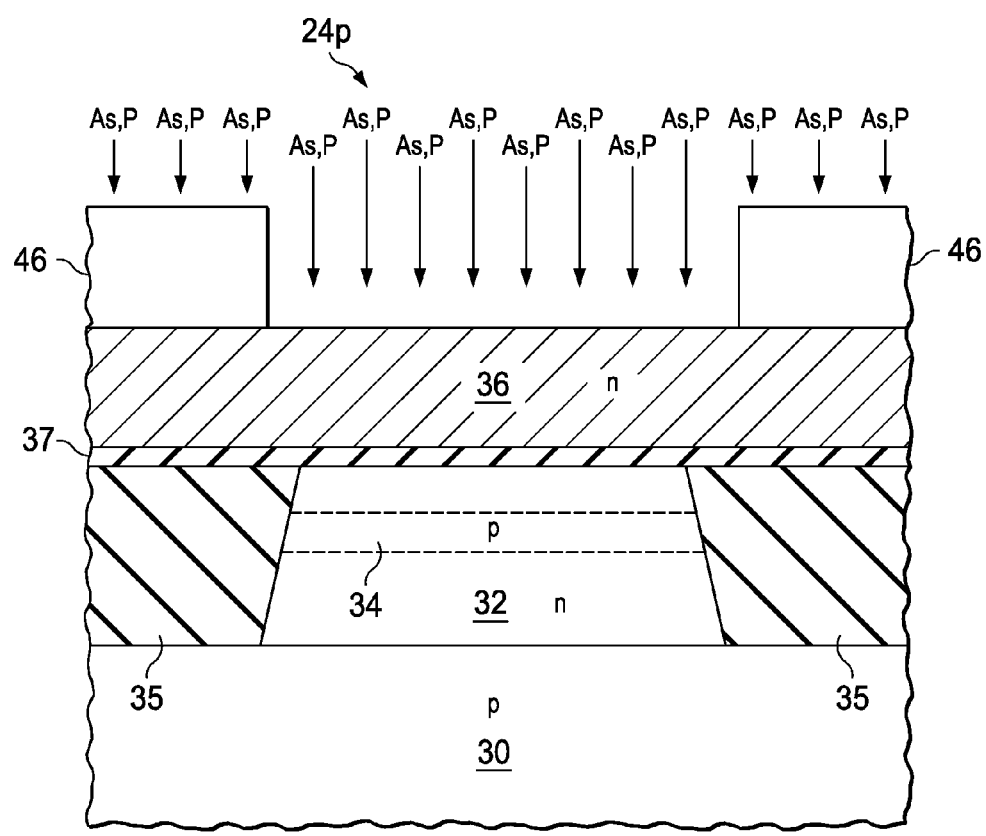

In process 57, portions of the polysilicon layer deposited in process 56, including those portions of the polysilicon layer including polysilicon element 36 at the location of p-channel transistor 24p, are doped n-type by way of a patterned ion implant of the appropriate species (e.g., arsenic or phosphorous). FIG. 5c illustrates a cross-section of p-channel transistor 24p during this process 57. The dose and energy of the n-type implant in this process 57 is contemplated to be sufficient to ensure that the eventual gate structure for p-channel transistor 24p remains n-type, considering the subsequent counterdoping effect of p-type source/drain implant processes (described below). Any portions of this polysilicon layer not to receive this n-type implant (e.g., those locations of the integrated circuit at which surface channel p-channel transistors are to be formed) will be protected from the implant of process 57 by patterned photoresist structures 46, as shown in FIG. 5c. Conversely, p-type ion implantation may be performed at this point in the process, for example to establish the desired p-type dopant concentration in those locations of the polysilicon layer protected from the n-type implant; if so, the portion of polysilicon layer 36 at the location of transistor 24p will be protected from that p-type poly implant by the appropriate patterned photoresist structure.

In process 58, polysilicon elements 36 are photolithographically patterned and etched to define the various structures in the eventual integrated circuit that are to be formed in this polysilicon layer, including analog floating-gate electrode 22, and other structures such as the silicide-clad lower plate of unrelated capacitor 11 (FIG. 3a), transistor gates, and the like. While polysilicon implant process 57 is shown in this process flow as occurring prior to etch process 58, process 57 may instead be performed after the patterned etch of process 58. As mentioned above, additional doping of polysilicon elements may also occur later in the process, for example during the source/drain implant processes (process 60 below).

Figure 5D:
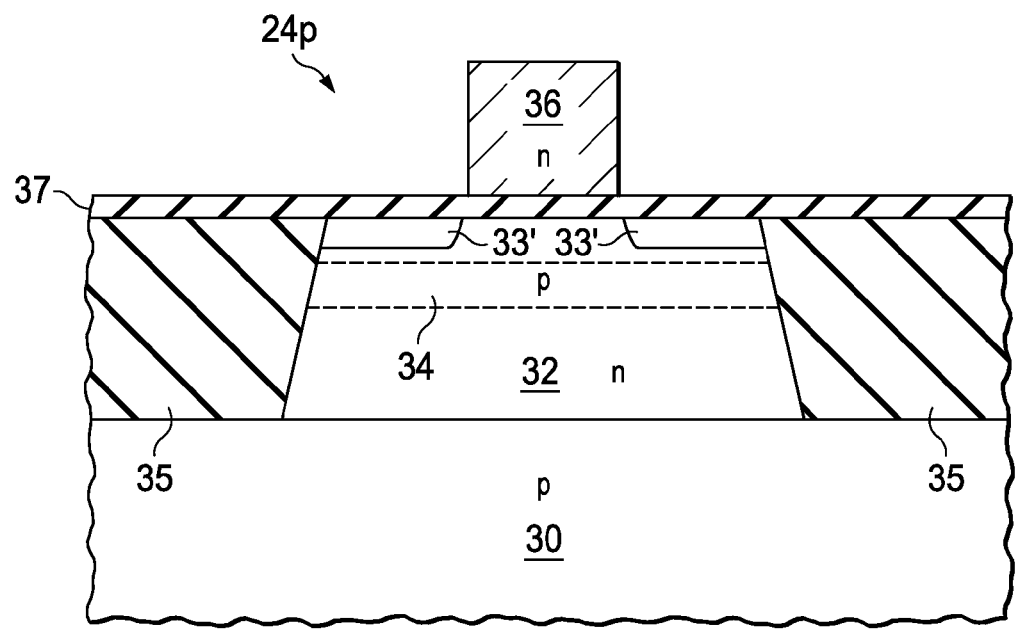
Figure 5E:
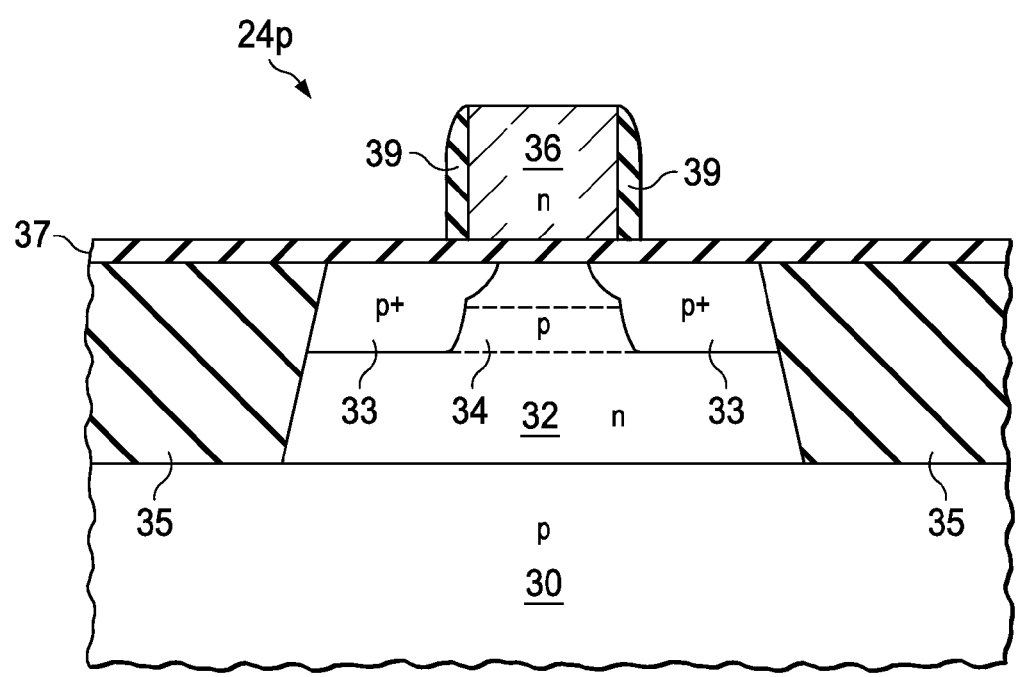

In this example, in which graded source/drain junctions are implemented as typical in modern CMOS manufacturing, a drain extension implant (also referred to as "lightly-doped-drain", or LDD, implant) is performed in a self-aligned manner relative to the remaining polysilicon features overlying active areas, in process 59. If desired, the LDD implant may be performed for both n-channel and p-channel transistors, by way of masked implants. FIG. 5d illustrates the location of substrate 30 following patterned etch process 58 and LDD implant process 59, showing drain extensions 33'; of course, the dopant implanted via this LDD implant may not reach the full depth of drain extensions 33' as shown, if the activation anneal is not performed at this stage of manufacture. Following the drain extension implant, a silicon nitride layer is then deposited overall and anisotropically etched, also in this process 59, to form sidewall nitride elements 39 (FIGS. 3b and 3d).

Once sidewall nitride elements 39 are formed in this manner, masked source/drain implants of both n-type and p-type are then performed, in process 60, self-aligned to the gate level structures within the respective active regions 45, in the usual manner. As mentioned above, this source/drain implant of p-type dopant in process 60 is insufficient to counterdope the portion of polysilicon element 36 at transistor 24p, leaving this structure as n-type polysilicon due to the dose of poly implant 57. Following process 60, the appropriate anneal or other high-temperature drive-in process to place the implanted dopant at the desired depth, in process 62. The resulting structure of p-channel transistor 24p of the buried channel type, at its stage of manufacture following process 62, is shown in cross-section in FIG. 5e.

In some embodiments of this invention, as described above, analog floating-gate electrode 22 is protected from direct react silicidation, while other structures (the lower plate of capacitor 11, transistor gates, polysilicon interconnects, etc.) are silicide-clad. As such, silicide-block silicon dioxide 38 is deposited overall in process 64. Materials other than silicon dioxide may alternatively be used for this silicide block material; however, because this layer eventually becomes part of the capacitor dielectric for storage capacitor 26, it should of course be electrically insulating. In order for analog floating-gate electrode 22 to retain trapped charge for long periods of time, the silicide-block layer deposited in process 61 should be a high quality dielectric, from a leakage standpoint. Silicon dioxide is contemplated to be a suitable film for this purpose.

Silicide-block silicon dioxide layer 38 is photolithographically patterned and etched in process 66. According to embodiments of this invention, as described above, silicide-block silicon dioxide layer 38 is removed from those locations and instances of polysilicon element 36 that are to be silicide-clad, but retained at analog floating-gate electrode 22 and other elements that are not to be silicide-clad. It is contemplated that, in most implementations, most if not all polysilicon gate-level structures other than structures serving the function of analog floating-gate electrodes 22 will be silicide-clad, and as such will have silicide-block silicon dioxide layer 38 removed therefrom in process 66.

Following etch process 66, direct silicidation of a metal at exposed locations of silicon is then performed, in process 68. As conventional in the art, this direct react silicidation involves the deposition of the silicidation metal, such as cobalt, titanium, tungsten, and the like, followed by a high temperature anneal to react this deposited metal at those locations at which the metal is in contact with underlying silicon, to form a metal silicide compound. Conversely, those silicon structures that are not in contact with the silicidation metal, such as the extent of analog floating-gate electrode 22 protected by silicide-block silicon dioxide layer 38 remaining after etch process 66, will not react with the deposited metal. A conventional etch or strip is then performed to remove the unreacted metal and byproducts from the surface, leaving silicide cladding 44 behind wherever formed.

In process 70, the remaining manufacturing processes for the eventual integrated circuit are then completed. Such remaining processes include the deposition of silicon nitride layer 40, following which the structures shown in FIGS. 3b through 3d are constructed. Silicon nitride layer 40 serves as the capacitor dielectric for capacitor 11, and as part of the capacitor dielectric for storage capacitor 26, and as such should be a relatively high quality film. Alternatively, other dielectric materials such as silicon dioxide can be used as this insulating film. The remaining structures formed and defined in process 70 include deposition and etch of the upper plate metal or metal compound for storage capacitor 26 and capacitor 11, deposition of additional insulating layers, etching of contacts, formation of metal or other conductor layers making contact to the elements described above, including the topside contacts to the various structures as desired, in the conventional manner. It is contemplated that those skilled in the art having reference to this specification will be readily able to implement those additional process steps as appropriate for the particular manufacturing process technology and the desired construction of the integrated circuit.

Embodiments of this invention provide important advantages in the fabrication of integrated circuits, including analog integrated circuits and circuits including adjustable or trimmable elements, such as reference circuits. More particularly, embodiments of this invention provide an analog floating-gate electrode structure that can be programmed and erased to precisely set an adjustable level of trapped charge that can define a particular analog level for an electronic circuit. This structure is capable of retaining that trapped charge for long periods of time, and as such is suitable for use as an element that is trimmable or adjustable at manufacture. In addition, this structure can be constructed in a manner that is compatible with existing manufacturing process flows, without unduly complicating the process flows required. Furthermore, according to this invention, analog floating-gate electrodes suitable for use as gates of both n-channel and p-channel MOS transistors, including doped silicon gates of the corresponding conductivity types for those transistors, can be readily fabricated without the undesired rectifying effects of parasitic diodes at the p-n junctions within that polysilicon electrode. In addition, these benefits are attained without changing the electrical characteristics and parameters of other devices in the integrated circuit.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an electrically programmable capacitor structure for an analog semiconductor integrated circuit, formed at a semiconductor surface of a body, comprising the steps of:
   forming isolation dielectric structures at selected locations of the semiconductor surface, the isolation dielectric structures defining active regions of the surface therebetween;
   forming a gate dielectric layer over the active regions;
   then forming an electrode layer comprised of polycrystalline silicon overall;
   removing selected portions of the electrode layer to define a first electrode comprised of polycrystalline silicon; the first electrode including a portion overlying an isolation dielectric structure and a plurality of portions overlying active regions;
   doping the polycrystalline silicon to a first conductivity type;
   performing an ion implantation of dopant of a second conductivity type, opposite to the first conductivity type, into a first active region to define a buried transistor channel;
   forming source and drain regions of the second conductivity type on opposite sides of a portion of the first electrode overlying the first active region;
   then depositing a dielectric film overall;
   then depositing a conductor layer comprising a metal; and
   removing selected portions of the conductor layer to define a first conductive plate overlying the dielectric film and a portion of the first electrode, at a location overlying an isolation dielectric structure.

2. The method of claim 1, wherein the step of removing selected portions of the electrode layer also defines a second electrode of polycrystalline silicon; wherein the method further comprises:
   forming a layer of silicon dioxide over the first and second electrodes;
   removing the silicon dioxide selectively from the second electrode and from an opening at the first location of the first electrode, so that the silicon dioxide remains over the first electrode at locations other than the first location;
   after the step of removing the silicon dioxide, reacting exposed portions of the polycrystalline silicon, including the second electrode and at the first location of the first electrode, with a metal to form a metal silicide.

3. The method of claim 2, wherein the step of removing selected portions of the conductor layer also defines a second conductive plate overlying the dielectric film and a portion of the second electrode, at a location overlying an isolation dielectric structure.

4. The method of claim 1, wherein the first conductivity type is n-type and the second conductivity type is p-type.

5. The method of claim 4, wherein the first electrode overlies second and third active regions;
   wherein the step of forming source and drain regions forms n-type source and drain regions on opposite sides of the first electrode overlying the second active region;
   and wherein the step of forming source and drain regions forms p-type source and drain regions on opposite sides of the first electrode overlying the third active region.

* * * * *